United States Patent [19]

Kase

[11] Patent Number: 5,231,320
[45] Date of Patent: Jul. 27, 1993

[54] CMOS DELAY LINE HAVING DUTY CYCLE CONTROL

[75] Inventor: Kiyoshi Kase, Chiba, Japan

[73] Assignee: Motorola, Inc., Schaumburg, Ill.

[21] Appl. No.: 947,084

[22] Filed: Sep. 18, 1992

Related U.S. Application Data

[63] Continuation of Ser. No. 760,659, Sep. 16, 1991, abandoned.

[51] Int. Cl.$^5$ .................. H03K 5/12; H03K 3/017; H03K 5/13
[52] U.S. Cl. .................. 307/605; 307/263; 307/265; 307/602
[58] Field of Search ........... 307/605, 263, 268, 265, 307/601, 602, 603, 359; 328/55, 56

[56] References Cited

U.S. PATENT DOCUMENTS

| | | | |
|---|---|---|---|
| 3,024,417 | 3/1962 | Secretan | 328/56 |
| 3,735,270 | 5/1973 | Holub | 328/55 |
| 4,585,952 | 4/1986 | Yamamoto | 307/268 |
| 4,899,071 | 2/1990 | Morales | 307/605 |
| 4,922,141 | 5/1990 | Lofgren et al. | 307/602 |

Primary Examiner—Jin F. Ng
Assistant Examiner—Sinh Tran
Attorney, Agent, or Firm—Michael D. Bingham

[57] ABSTRACT

A delay line having feedback from a control circuit at the output of the delay line controls the delay line duty cycle to within a specified range. The delay line comprises at least one delay unit having control inputs to each delay unit. The output of the delay line feeds to a low-pass filter (LPF). A voltage proportional to the duty cycle of the delay line output is generated within the LPF and fed to a differential amplifier. The differential amplifier is in turn coupled to the control inputs of each of the delay units. When the voltage signal from the LPF is high (duty cycle is high), the differential amplifier will generate a signal causing the fall time of the signal propagating through the delay line to increase and rise time to decrease. This will decrease the high cycle time at the output of the delay line. When the voltage signal from the LPF is low (duty cycle is low), the differential amplifier will generate a signal causing the fall time to decrease and the rise time to increase. This will increase the high cycle time at the output of the delay line.

14 Claims, 3 Drawing Sheets

CMOS DELAY LINE HAVING DUTY CYCLE CONTROL

This application is a continuation of prior application Ser. No. 07/760,659, filed Sep. 16, 1991 now abandoned.

BACKGROUND OF THE INVENTION

This invention relates, in general, to CMOS delay lines.

CMOS delay lines are often used for high frequency clock synchronization for video signals and parallel micro controller units (MCU).

A CMOS delay line is generally composed of multiple CMOS inverters or a cascaded CMOS inverter chain such as 32-stage series inverters. Each inverter, or cascaded inverter, has a slightly different rise and fall time as well as slightly different threshold voltage. Such variations are caused by small geometric mismatches of the transistors and stray capacitance around the transistors.

As a digital signal is propagated through the multiple or cascaded inverters, the small variations in rise and fall times accumulate. The output duty cycle time of the signal (duty cycle time is the portion of the input signal registering a high, or above the threshold voltage) will be changed from the original input signal to be delayed.

A worst case scenario involves a high frequency input signal having a low duty cycle time. In this case, the output pulse can become very narrow and generate a clock re-synchronization malfunction in the circuits the delay line is outputting to.

To avoid the problems of signal mismatching and narrow output pulses, the duty cycle time must be controlled to maintain a duty cycle approximately equal to the input signal duty cycle.

Furthermore, it is desirable to maintain a certain duty cycle range generated by each individual delay inverter. This allows control of the total duty cycle generated by the entire string or series of delay inverters.

SUMMARY OF THE INVENTION

A delay line having feedback from a control circuit at the output of the delay line controls the delay line duty cycle to within a specified range. The delay line comprises at least one delay unit having control inputs to each delay unit. The output of the delay line feeds to a low-pass filter (LPF). A voltage proportional to the duty cycle of the delay line output is generated within the LPF and fed to a differential amplifier. The differential amplifier is in turn coupled to the control inputs of each of the delay units. When the voltage signal from the LPF is high (duty cycle is high), the differential amplifier will generate a signal causing the fall time of the signal propagating through the delay line to increase and rise time to decrease. This will decrease the high cycle time at the output of the delay line. When the voltage signal from the LPF is low (duty cycle is low), the differential amplifier will generate a signal causing the fall time to decrease and the rise time to increase. This will increase the high cycle time at the output of the delay line.

The above and other objects, features, and advantages of the present invention will be better understood from the following detailed description taken in conjunction with the accompanying drawings.

DETAILED DESCRIPTION OF THE INVENTION

Figure 1:
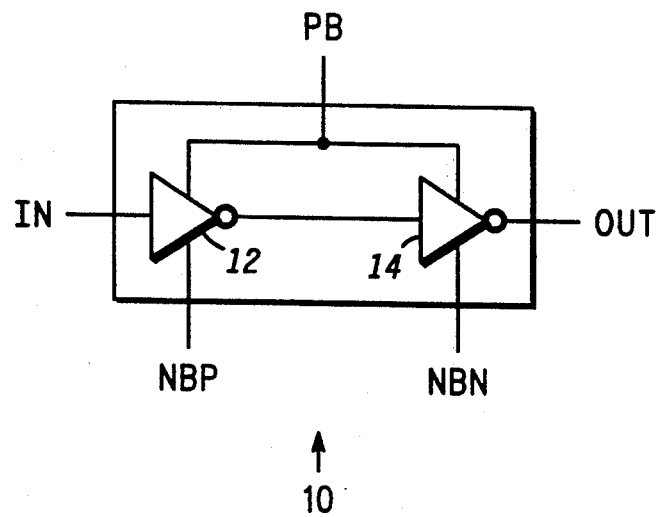
FIG. 1 is a schematic of a delay unit for a CMOS delay line according to the present invention.

The basic delay unit for a CMOS delay line according to the present invention is shown in FIG. 1 and comprises a CMOS inverter with cascaded P-channel current sources and N-channel current sources. The delay unit 10 comprises two inverters 12 and 14. The operation of inverters 12 and 14 will be explained below. A voltage represented by NBP supplies inverter 12, and another voltage represented by NBN supplies inverter 14. The significance of these two voltages is also described later.

Figure 2:
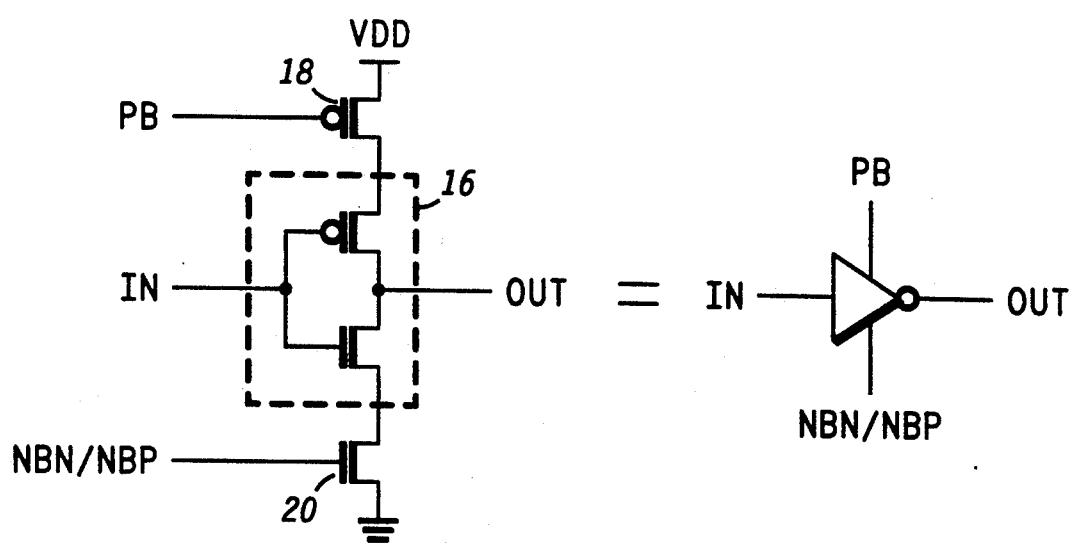
FIG. 2 is a schematic of a portion of the delay unit of FIG. 1 showing the components thereof according to the present invention.

FIG. 2 shows the construction of each of the inverters 12 and 14. Specifically, inverter portion 16 is controlled by signals from two transistors; P-channel transistor 18 and N-channel transistor 20. P-channel transistor 18 receives a constant current thus generating a bias voltage for inverters 12 and 14. The bias voltage at P-channel transistor 18 controls the total cycle time (high and low level combined) of each delay unit. A voltage input at N-channel transistor 20 controls the high level or duty cycle time of each delay unit.

Figure 3:
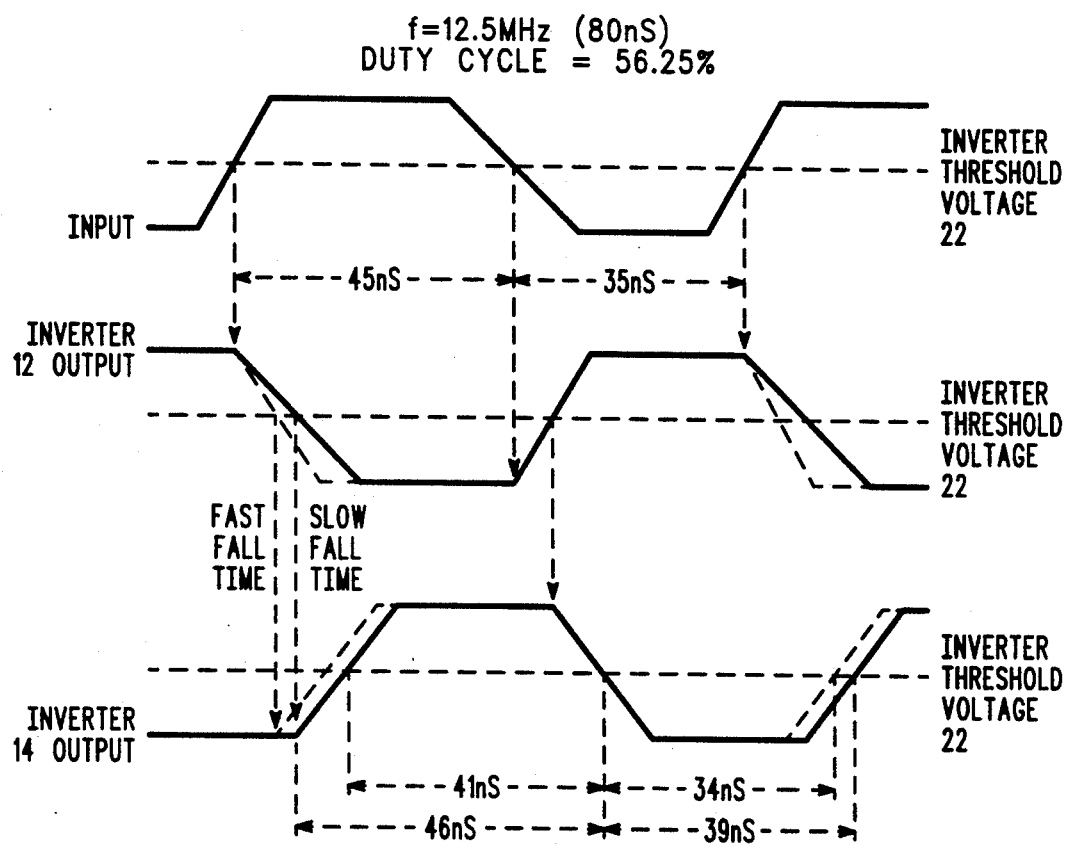
FIG. 3 is a plot of an input digital signal at the input, after passing through the first half of the delay unit of FIG. 1, and at the output of the delay unit of FIG. 1 according to the present invention.

FIG. 3 shows an input digital signal at the input, and the signal as it passes through inverter 12 and inverter 14. When input, the signal has a duty cycle of 56.25%. In other words, with reference to the threshold voltage 22, the signal registers a high level (above threshold voltage 22) for 45 nS (nano seconds), and the signal registers a low level (below threshold voltage 22) for 35 nS. The duty cycle is the percent of time greater than threshold voltage 22 as compared with the total cycle time. Therefore, with this signal's frequency of 12.5 MHz or 80 nS, the duty cycle is found by 45/80 equals 0.5625 or 56.25% duty cycle.

As seen from the outputs of inverters 12 and 14 in FIG. 3, the rate of fall time will affect the total high level and total low level time at the output. The total cycle time remains constant. As the fall time increases (represented as slow fall time), the high level time, or duty cycle, remains constant. As the fall time decreases (fast fall time), the high level time increases causing a decrease in the low level time.

The duty cycle time is similarly affected by the rise time. In FIG. 3, the rise time in inverter 14 output is shown as shifted by the fast or slow fall times. Although shifted, the rate, or slope, of rise remains constant. It should be noted that although the rise time is shown constant in FIG. 3, the slope or rate of change of the rise time generally changes as the fall time slope changes. The two (rise and fall times) act in conjunction with each other.

In the example of FIG. 3, the fast fall time causes a high level of 46 nS (increase of 1 nS) for a duty cycle of 57.5%. The low level has decreased to 34 nS. The slow fall time causes a high level of 41 nS (decrease of 4 nS) with a duty cycle of 51.25% and an increased low level of 39 nS.

Given the degree of variation in duty cycle time in just one delay unit such as delay unit 10, it is easy to understand why there must be a control on the fall, and/or the rise, time of the digital signal in the delay line. For instance, assume an implementation of 32 delay units such as may be used for high frequency clock synchronization application like video signaling and parallel micro controller unit (MCU) clock synchronization. These delay units are coupled together in series. As a digital signal propagates through the string of delay units, in the example of FIG. 3, the final additional duty cycle time accumulated through the delay line for the fast fall time would be 32 nS (an increase of 1 nS per delay unit) resulting in a high level signal of 77 nS or almost 100% of the signal. On the other hand, the slow fall time results in $(-4 \text{ nS}) \times 32 = -128$ nS. In other words, the signal would not be present at the output.

Figure 4:
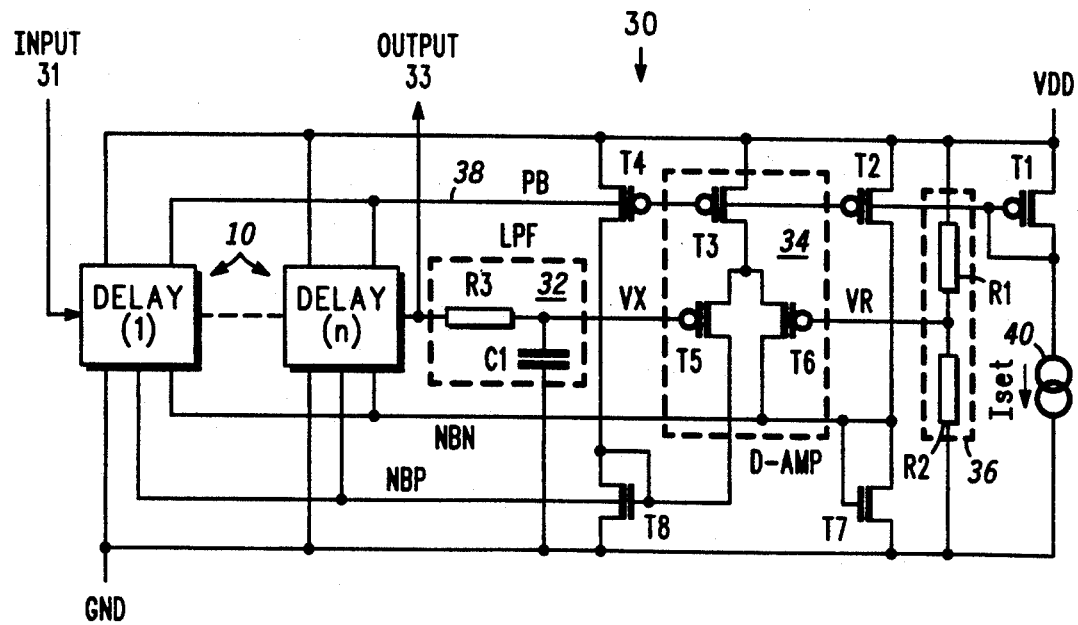
FIG. 4 is a schematic of the CMOS delay line having duty cycle control according to the present invention.

FIG. 4 shows the entire circuitry of a CMOS delay line 30 according to the present invention. In general, CMOS delay line 30 comprises n delay units 10 (in the previous example, n=32 delay units), low pass filter (LPF) 32, differential amplifier 34, and voltage divider 36.

As mentioned previously in relation to FIGS. 1 and 2, a bias voltage is supplied to the P-channel transistor (16) of each delay unit 10. This bias voltage is maintained at a constant voltage to maintain the total cycle time. The constant voltage is supplied through line 38 from transistor T1. The voltage is generated within T1 by a constant current "Iset". Iset is set at a constant by current source 40. Current mirrors T2, T3, and T4 mirror the current Iset for transistors T7, T5 and T6, and T8 respectively.

The line for voltage NBN is coupled from delay units 10 to transistor T7. The voltage generated by current through T7 controls inverter 14 of each delay unit 10. The line for voltage NBP is coupled from delay units 10 to transistor T8. The voltage generated by current through T8 controls inverter 14 of each delay unit 10.

LPF 32 is coupled to the output from the series delay units 10 to receive the delayed outputs, and is further coupled to differential amplifier 34. LPF 32 may be a simple low pass filter comprised of a resistance R3 and a capacitance to ground C1.

Differential amplifier 34 is comprised of current mirror transistor T3, and transistors T5 and T6 coupled in parallel to current mirror transistor T3. T5 is coupled to the output of LPF 32 as well as coupled to transistor T8. Transistor T6 is coupled to voltage divider 36. Voltage divider 36 supplies a constant voltage to transistor T6 equal to $V_{DD}/2$, or generally 5 V/2=2.5 V. Transistor T6 is also coupled to transistor T7.

The circuit input 31 is coupled to the first delay unit 10, and the circuit output 33 is coupled to the last delay unit 10.

The operation of CMOS delay line 30 is as follows. Iset is generated by current source 40 and is a constant. Iset generates a voltage in transistor T1 as it passes through. The current Iset is mirrored by transistors T2, T3, and T4. Since Iset is always a constant, the voltage supplied from transistor T1 is also a constant. This voltage is supplied to each P-channel transistor 18 of each delay unit 10. As explained above, this supplies a constant current source to inverters 12 and 14 of the delay unit 10 generating a constant bias voltage.

The current Iset is continuously passing through transistors T7 and T8 due to current mirror transistors T2 and T4 respectively. This generates the two voltages NBN and NBP. Without the addition of current from another source (i.e. transistors T5 and T6), voltages NBN and NBP would remain constant.

Each digital signal passing through the delay units 10 is output to LPF 32. LPF 32 will output a voltage signal proportional to the length of the duty cycle. If the duty cycle time at the output is long, LPF 32 will output a high voltage signal to transistor T5 of differential amplifier 34. Transistor T5 is continuously on. Therefore, a high voltage signal will reduce the current through T5. The degree to which the current through T5 is reduced is proportional to the signal from LPF 32. As the current through T5 is reduced, more current will be supplied through T6. The increased current through T6 will then generate a proportional and additional voltage at T7 which is transmitted to the NBN, and therefore to N-channel transistor 16 of inverter 14 (second half of delay unit 10) of delay units 10. At the same time, the decrease of current through T5 will drain current from T8 causing a decrease in the voltage NBP. The net result of an increased NBN voltage and decreased NBP voltage is a fast rise and slow fall time in inverter 12, and slow rise and fast fall time in inverter 14. This results in a reduced duty cycle in each delay unit 10.

As the voltage from LPF 32 decreases, the current through T5 will increase and the current through T6 will decrease. Therefore the current through T8 will increase generating a higher voltage signal in NBN, while the current through T7 will be proportionally drained dropping the voltage of NBN. The result of a decreased NBN voltage and increased NBP voltage is a slow rise and fast fall time in inverter 12, and fast rise and slow fall time in inverter 14. The net result is an increase duty cycle in each delay unit 10.

From the above description, one skilled in the art will recognize that voltage divider 36 sets the duty cycle (%) of the delay units 10.

Figure 5:
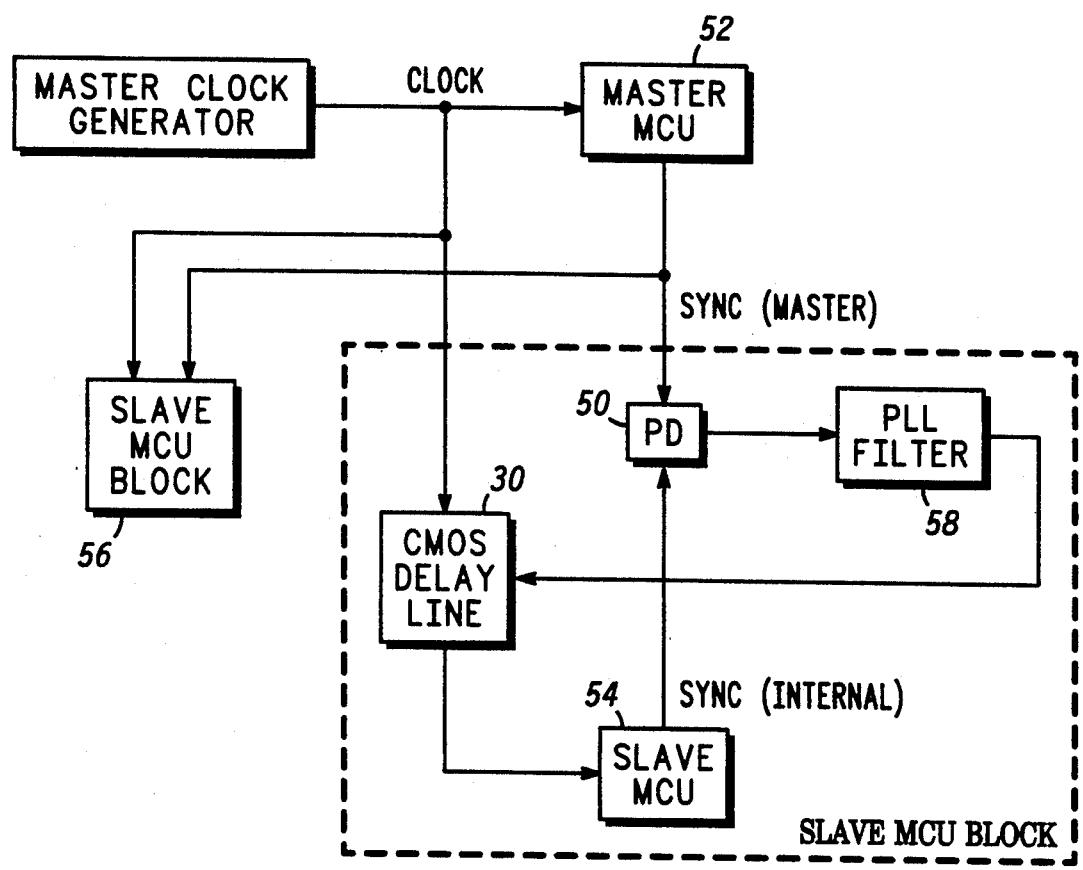
FIG. 5 is a schematic of a multiple MCU system utilizing the CMOS delay line of the present invention.

FIG. 5 shows one use of CMOS delay line 30. In this particular embodiment, the CMOS delay line is a clock synchronizer for multiple MCU's. The synchronization is required to minimize processing skew among the different MCU's (slave and master).

In FIG. 5, a phase detector (PD) 50 determines the skew time of the master MCU 52 in relation to slave MCU 54 and other slave MCU blocks 56. The output of PD 50 controls, through a phase lock loop filter 58, the Iset of CMOS delay line 30.

Thus there has been provided, in accordance with the present invention, a CMOS delay line having duty control that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A delay line for supplying a controlled time delay to an input signal, the delay line comprising:

at least one delay unit coupled to an input;

each of said at least one delay unit having a control input;

the input signal propagating through said at least one delay unit and accumulating a change in a duty cycle;

said at least one delay unit having an output wherein said input signal is output having a total duty cycle;

means for outputting a duty cycle voltage, the value of said duty cycle voltage being proportional to the value of said total duty cycle;

said means for outputting coupled to said output of said at least one delay unit to receive said total duty cycle;

first and second voltage generator means for generating a correction voltage signal when a constant current is applied;

current means for supplying said constant current;

first transistor coupled to said first voltage generator means, said first transistor further coupled to said current means;

second transistor coupled to said second voltage generator means, said second transistor further coupled to said current means;

said first transistor coupled to said means for outputting to receive said duty cycle voltage;

flow of current through said first transistor reducing when said duty cycle voltage increases causing an increase in the flow of current through said second transistor;

flow of current through said first transistor increasing when said duty cycle voltage decreases causing a decrease in flow of current through said second transistor;

flow of current through said second transistor increasing when said duty cycle voltage increase;

flow of current through said second transistor decreasing when said duty cycle voltage decreases;

said second transistor coupled to a constant voltage source;

said first and second voltage generator means coupled to said control input of each of said at least one delay unit;

said first voltage generator means outputting said correction voltage signal to each of said at least one delay unit causing a decrease in said duty cycle;

said second voltage generator means outputting said correction voltage signal to each of said at least one delay unit causing an increase in said duty cycle;

the value of said correction voltage signal from said first and second voltage generator means controlled by current from said first and second transistors respectively.

2. A delay line for supplying a controlled time delay to an input signal, the delay line comprising;

at least one delay unit coupled to an input;

each of said at least one delay unit having a control input;

the input signal propagating through said at least one delay unit and accumulating a change in a duty cycle;

means for generating a correction voltage signal, the value of said correction voltage signal being proportional to a value of said total duty cycle;

said means for generating coupled to an output of said at least one delay unit to receive said total duty cycle;

said means for generating coupled to said control input of each of said at least one delay unit, each of said at least one delay unit receiving said correction voltage signal from said means for generating;

each of said at least one delay unit adjusting said duty cycle according to said correction voltage signal;

bias means;

each of said at least one delay unit having a bias input;

said bias means having an output coupled to said bias input of each of said at least one delay unit;

said bias means for supplying a bias voltage to said bias input of each of said at least one delay unit;

said bias voltage generated within said bias means by a constant current;

a current source supplying said constant current to said bias means;

said current source coupled to said bias means.

3. A delay line for supplying a controlled time delay to an input signal according to claim 2 wherein said bias means comprises a transistor.

4. A delay line for supplying a controlled time delay to an input signal according to claim 2 wherein said means for generating comprises:

means for outputting a duty cycle voltage, the value of said duty cycle voltage being proportional to the value of said total duty cycle;

said means for outputting coupled to said output of said at least one delay unit to receive said total duty cycle;

differential amplifier means coupled to said said means for outputting to receive said duty cycle voltage;

said differential amplifier means having a first and second output;

said differential amplifier means for increasing current through said first output and decreasing current through said second output when said duty cycle voltage is small, or alternatively decreasing current through said first output and increasing current through said second output when said duty cycle is large;

first and second voltage generator means for generating a voltage when a current is applied;

said first and second voltage generator means coupled to said first and second outputs of said differential amplifiers respectively;

said first and second voltage generator means coupled to each of said at least one delay unit;

said first voltage generator means outputting said correction voltage signal causing a decrease in said duty cycle;

said second voltage generator means outputting said correction voltage signal causing an increase in said duty cycle; and the value of said correction voltage signal from said first and second voltage generator means controlled by current from said first and second outputs of said differential amplifier means respectively.

5. A delay line for supplying a controlled time delay to an input signal according to claim 4 wherein said differential amplifier means comprises:

first current means coupled to said output of said bias means;

first transistor coupled to said first output, said first transistor further coupled to said first current means;

second transistor coupled to said second output, said second transistor further coupled to said first current means;

said first current means supplying a current mirroring said constant current from said bias means to said first and second transistors;

said first transistor coupled to said means for outputting to receive said duty cycle voltage;

flow of current through said first transistor reducing when said duty cycle voltage increases causing an increase in the flow of current through said second transistor;

flow of current through said first transistor increasing when said duty cycle voltage decreases causing a decrease in flow of current through said second transistor; and said second transistor coupled to a constant voltage source.

6. A delay line for supplying a controlled time delay to an input signal according to claim 5 wherein the delay line further comprises:

second current means coupled to said first voltage generator means and to said output of said bias means;

said second current means supplying a current mirroring said constant current from said bias means to said first voltage generator means;

third current means coupled to said second voltage generator means and to said output of said bias means; and said third current means supplying a current mirroring said constant current from said bias means to said second voltage generator means.

7. A delay line for supplying a controlled time delay to an input signal according to claim 6 wherein said second current means comprises a transistor.

8. A delay line for supplying a controlled time delay to an input signal according to claim 4 wherein said means for outputting a duty cycle voltage comprises a low pass filter.

9. A delay line for supplying a controlled time delay to an input signal according to claim 5 wherein said first current means comprises a transistor.

10. A delay line for supplying a controlled time delay to an input signal according to claim 6 wherein said third current means comprises a transistor.

11. A delay line for supplying a controlled time delay to an input signal comprising:

at least one delay unit coupled to an input;

each of said at least one delay unit having a control input;

the input signal propagating through said at least one delay unit and accumulating a change in a duty cycle;

said at least one delay unit having an output wherein said input signal is output having a total duty cycle;

means for outputting a duty cycle voltage, the value of said duty cycle voltage being proportional to the value of said total duty cycle;

said means for outputting coupled to said output of said at least one delay unit to receive said total duty cycle;

first and second voltage generator means for generating a correction voltage signal when a constant current is applied;

current means for supplying said constant current;

first transistor coupled to said first voltage generator means, said first transistor further coupled to said current means;

second transistor coupled to said second voltage generator means, said second transistor further coupled to said current means;

said first transistor coupled to said means for outputting to receive said duty cycle voltage;

flow of current through said first transistor reducing when said duty cycle voltage increases causing an increase in the flow of current through said second transistor;

flow of current through said first transistor increasing when said duty cycle voltage decreases causing a decrease in flow of current through said second transistor;

said second transistor coupled to a constant voltage source;

current increasing through said first transistor and decreasing through said second transistor when said duty cycle voltage in small, or alternatively decreasing through said first transistor and increasing through said second transistor when said duty cycle is large;

said first and second voltage generator means coupled to said control input of each of said at least one delay unit;

said first voltage generator means outputting a first correction voltage signal causing a decrease in said duty cycle;

said second voltage generator means outputting a second correction voltage signal causing an increase in said duty cycle;

the value of said first and second correction signals from said first and second voltage generator means controlled by current from said first and second transistors respectively; and each of said at least one delay unit adjusting said duty cycle according to said first and second correction voltage signals.

12. A delay line for supplying a controlled time delay to an input signal comprising:

at least one delay unit coupled to an input;

each of said at least one delay unit having a control input;

the input signal propagating through said at least one delay unit and accumulating a change in a duty cycle;

said at least one delay unit having an output wherein said input signal is output having a total duty cycle;

means for outputting a duty cycle voltage, the value of said duty cycle voltage being proportional to the value of said total duty cycle;

said means for outputting coupled to said output of said at least one delay unit to receive said total duty cycle;

first and second voltage generator means for generating a correction voltage signal when a current is applied;

differential amplifier means coupled to said means for outputting to receive said duty cycle voltage;

said differential amplifier means having a first and second output;

said differential amplifier means for increasing current through said first output and decreasing current through said second output when said duty cycle voltage is small, or alternatively decreasing current through said first output and increasing current through said second output when said duty cycle is large;

said first and second voltage generator means coupled to said first and second outputs of said differential amplifier means respectively;

said first and second voltage generator means coupled to said control input of each of said at least one delay unit;

said first voltage generator means outputting a first correction voltage signal causing a decrease in said duty cycle;

said second voltage generator means outputting a second correction voltage signal causing an increase in said duty cycle;

the value of said first and second correction signals from said first and second voltage generator means controlled by current from said first and second transistors respectively; and each of said at least one delay unit adjusting said duty cycle according to said first and second correction voltage signals;

bias means;

each of said at least one delay unit having a bias input;

said bias means having an output coupled to said bias input of each of said at least one delay unit;

said bias means for supplying a bias voltage to said bias input of each of said at least one delay unit;

said bias voltage generated within said bias means by a constant current;

a current source supplying said constant current to said bias means;

said current source coupled to said bias means.

13. A delay line for supplying a controlled time delay to an input signal according to claim 12 wherein said differential amplifier means comprises:

first current means coupled to said output of said bias means first transistor coupled to said first output, said first transistor further coupled to said first current means;

second transistor coupled to said second output, said second transistor further coupled to said first current means;

said first current means supplying a current mirroring said constant current from said bias means to said first and second transistors;

said first transistor coupled to said means for outputting to receive said duty cycle voltage;

flow of current through said first transistor reducing when said duty cycle voltage increases causing an increase in the flow of current through said second transistor;

flow of current through said first transistor increasing when said duty cycle voltage decreases causing a decrease in flow of current through said second transistor; and said second transistor coupled to a constant voltage source.

14. A delay line for supplying a controlled time delay to an input signal according to claim 13 wherein the delay line further comprises:

second current means coupled to said first voltage generator means and to said output of said bias means;

said second current means supplying a current mirroring said constant current from said bias means to said first voltage generator means;

third current means coupled to said second voltage generator means and to said output of said bias means; and said third current means supplying a current mirroring said constant current from said bias means to said second voltage generator means.

* * * * *